United States Patent
Corrado et al.

(10) Patent No.: US 6,829,145 B1
(45) Date of Patent: Dec. 7, 2004

(54) SEPARABLE HYBRID COLD PLATE AND HEAT SINK DEVICE AND METHOD

(75) Inventors: Joseph P. Corrado, Marlboro, NY (US); Gary F. Goth, Pleasant Valley, NY (US); Randall G. Kemink, Poughkeepsie, NY (US); William P. Kostenko, Poughkeepsie, NY (US); Budy D. Notohardjono, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/671,263

(22) Filed: Sep. 25, 2003

(51) Int. Cl.[7] .................................................. H05K 7/20
(52) U.S. Cl. .................... 361/704; 361/707; 361/709; 361/711; 257/712; 257/718; 257/719; 165/80.3; 165/185; 174/15.1; 174/16.1; 174/16.3
(58) Field of Search .................................. 361/702, 703, 361/704, 709–711; 174/15.1, 16.1, 16.3; 257/706, 712, 718, 719; 165/80.3, 80.4, 185

(56) References Cited

U.S. PATENT DOCUMENTS

| | | | |
|---|---|---|---|
| 5,040,381 A | 8/1991 | Hazen | 62/3.2 |
| 5,159,529 A | 10/1992 | Lovgren et al. | 361/699 |
| 5,239,200 A | 8/1993 | Messina et al. | 257/714 |
| 5,251,098 A | 10/1993 | Schmidt | 361/717 |
| 5,285,347 A | 2/1994 | Fox et al. | 361/385 |
| 5,706,171 A * | 1/1998 | Edwards et al. | 361/705 |
| 5,805,430 A | 9/1998 | Atwood et al. | 361/829 |
| 5,834,335 A | 11/1998 | Buschbom | 438/107 |
| 5,875,096 A * | 2/1999 | Gates | 361/704 |
| 6,135,200 A | 10/2000 | Okochi et al. | 165/121 |
| 6,166,608 A | 12/2000 | Merriss et al. | 331/69 |
| 6,212,074 B1 | 4/2001 | Gonsalves et al. | 361/717 |
| 6,213,194 B1 | 4/2001 | Chrysler et al. | 165/80.3 |
| 6,252,771 B1 | 6/2001 | Jordan | 361/704 |
| 6,278,607 B1 * | 8/2001 | Moore et al. | 361/687 |
| 6,305,463 B1 | 10/2001 | Salmonson | 165/80.3 |
| 6,320,268 B1 * | 11/2001 | Lang et al. | 257/785 |
| 6,560,108 B2 * | 5/2003 | Lo et al. | 361/704 |

* cited by examiner

*Primary Examiner*—Boris Chervinsky
(74) *Attorney, Agent, or Firm*—Floyd A. Gonzalez; Cantor Colburn LLP

(57) ABSTRACT

An apparatus and method of cooling of an electronic module. The apparatus and method include a heat sink thermally coupled to the module, and a fastener configured to alter a clamping force therebetween as a result of the heat sink and the module formed of materials having a higher coefficient of thermal expansion (CTE) than the fastener.

28 Claims, 3 Drawing Sheets

SEPARABLE HYBRID COLD PLATE AND HEAT SINK DEVICE AND METHOD

BACKGROUND

The present invention relates generally to a heat dissipating component and, more particularly, to a separable hybrid cold plate and heat sink for use with an electronic device.

The removal of heat from electronic components is a problem continuously faced by electronic packaging engineers. As electronic components have become smaller and more densely packed on integrated boards and chips, designers and manufacturers now are faced with the challenge of how to dissipate the heat generated by these components. It is well known that many electronic components, especially semiconductor components such as transistors and microprocessors, are more prone to failure or malfunction at high temperatures. Thus, the ability to dissipate heat often is a limiting factor on the performance of the component.

Electronic components within integrated circuits have been traditionally cooled via forced or natural convective circulation of air within the housing of the device. In this regard, cooling fins have been provided as an integral part of the component package or as separately attached elements thereto for increasing the surface area of the package exposed to convectively-developed air currents. Electric fans have also been employed to increase the volumetric flow rate of air circulated within the housing. For high power circuits (as well as smaller, more densely packed circuits of presently existing designs), however, simple air circulation often has been found to be insufficient to adequately cool the circuit components.

It is also well known that heat dissipation, beyond that which is attainable by simple air circulation, may be effected by the direct mounting of the electronic component to a thermal dissipation member such as a "cold plate", evaporator, or other heat sink.

There are applications where cold plates or evaporators are used for the lower temperatures they can deliver, but space or cost considerations prevent full redundancy or backup cooling means. In these applications, an air cooled heat sink may provide sufficient redundancy for temporary higher temperature usage.

In such "hybrid" cooling applications it is advantageous to thermally isolate the heat sink from the cold plate/evaporator during normal usage to reduce ambient heatflow into the cold plate/evaporator. For example, if the heat sink is thermally in close contact with the cold plate when the cold plate is providing the primary means of cooling, the heat sink dumps considerable ambient heat into the cold plate as the cold plate literally chills the air between the heat sink fins thereby producing undesirable condensation.

Thus, a more efficient cooling system is desired when the cold plate between the heat sink and the module being cooled is functioning or providing the primary cooling of the module.

SUMMARY

This disclosure presents an apparatus and method for cooling an electronic module that includes coupling a heat sink in thermal contact to the electronic module via a cap defining one end of the electronic module forming an assembly. A fastener configured to clamp the heat sink to the electronic module is torqued down to apply a first clamping force between the heat sink and the electronic module at a reference temperature. The fastener is configured to apply a second clamping force between the heat sink and the electronic module in direct proportion to a temperature change of the assembly relative to the reference temperature.

In another embodiment, an apparatus and method for automatic thermal switching of the individual components of a cooling unit for electronics applications is disclosed. The hybrid cooling unit removes heat from a module primarily via a liquid coolant system having circulating coolant and includes a heat sink in separable thermal contact therewith, a fastener coupling the heat sink to the cold plate acts as an automatic thermal switch to alter the clamping force between the heat sink and cold plate. In this manner, the clamping force therebetween is high when the cold plate is not functioning and is lowered when the cold plate is providing the primary cooling means to a module coupled to the cold plate.

BRIEF DESCRIPTION OF THE DRAWINGS

The present disclosure will be better understood by those skilled in the pertinent art by referencing the accompanying drawings, where like elements are numbered alike in the several FIGURES, in which.

DETAILED DESCRIPTION

Figure 1:
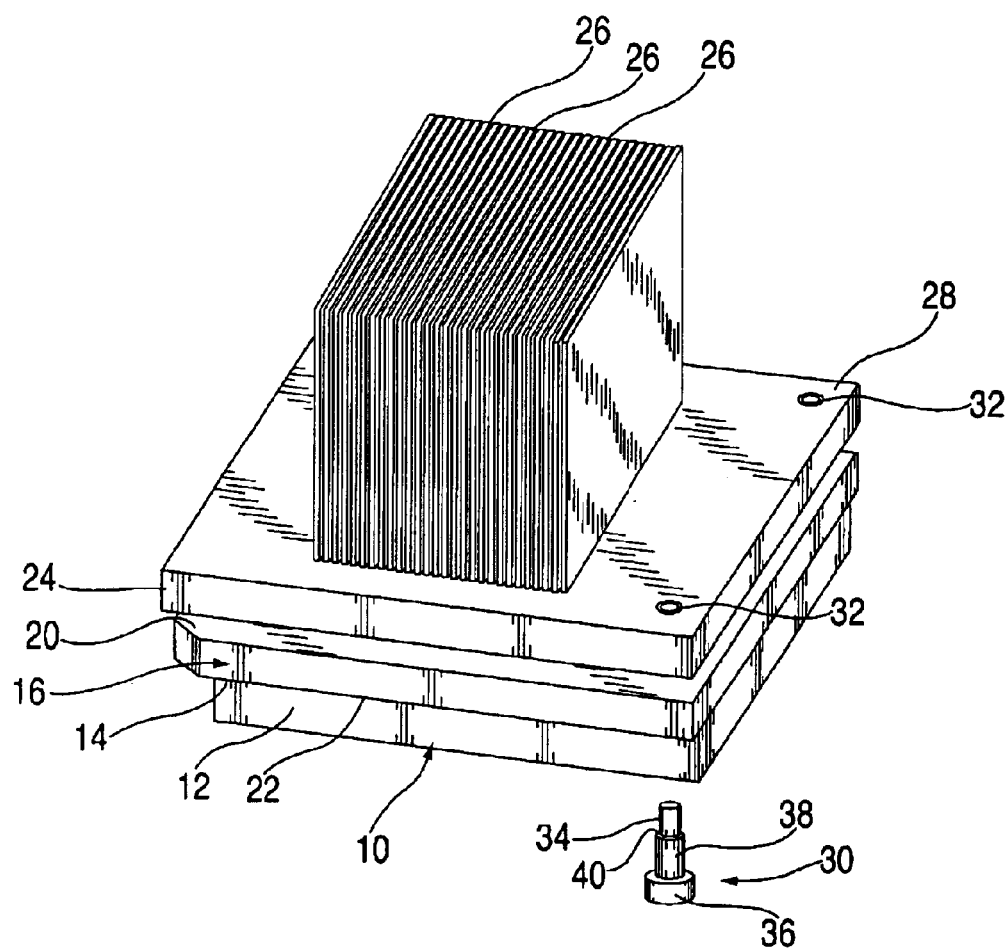
FIG. 1 is a perspective view of an exemplary embodiment of a cold plate evaporator unit in thermal communication with a heat sink and an electronic module opposite the heat sink illustrating a stepped fastener to couple and decouple the assembly.

Referring to FIG. 1, an exemplary embodiment of a separable hybrid cooling unit is shown generally at 10 and is hereinafter referred to as "cooling unit 10." Cooling unit 10 provides for the removal of heat from electronic circuitry via circulation of a liquid coolant or the dissipation of removed heat via forced convection of air when the liquid coolant is not circulating. The circulation of the liquid coolant allows heat to be transferred to the coolant and subsequently removed by a fan, for example, that forces air over the circulating coolant. Although cooling unit 10 is described as being incorporable into computer-based applications in which heat is removed from electronic circuitry and dissipated through a liquid medium, it should be understood by those of skill in the art that cooling unit 10 may be utilized in other applications in which heat is generated from a heat source and is to be dissipated to the surrounding environment. Furthermore, although cooling unit 10 is referred to as utilizing water as the circulating coolant, it should be understood by those of skill in the art that other liquids such as brine, alcohols, fluorocarbons, and halogenated hydrocarbons may be used.

A circuit module is shown generally at 12. Circuit module 12 includes a cap 14 or "top hat" of the module, as illustrated in FIG. 1. For example, circuit module 12 may be a processor module or multi-chip module (MCM). A circuit layer (not shown) is bonded to a substrate layer (not shown). The cap 14 of circuit module 12 is coupled to a cold plate or an evaporator 16 (herein after "cold plate 16), preferably fabricated of copper or aluminum. A layer of thermal grease, for example, may be applied between the cap 14 and the cold plate 16 at a thermal interface therebetween to increase heat flow, however other suitable materials including a phase change material are contemplated at this thermal interface and is not limited to thermal grease. The thermal grease provides a thermally uniform coupling between the cap 14 and cold plate 16. For instance, the cap 14 and the cold plate 16 may have their mating surfaces milled flat to approximately +/−0.5 mil when a thickness of cold plate 16 is about 10 mm or more. Due to irregularities in the mating surfaces of +/−0.5 mil or less, the two surfaces do not uniformly contact at all places thus forming air gaps in the interface. The thermal grease fills the air gaps between the mating surfaces of cap 14 and cold plate 16 providing uniform thermal coupling between the two components. The thermal interface is maintained by fixing the circuit module 12 to the cold plate 16 by mechanical means such as screws or clamps (not shown).

On a top surface 20 opposite a bottom surface 22 of cold plate 16, a heat sink assembly 24 is disposed. In an exemplary embodiment, heat sink assembly 24 is cast in a shape having a very high surface area to mass ratio having a plurality of parallel spaced heat sink fins 26 extending from a base 28 defining heat sink 24. Base 28 and plurality of heat sink fins 26 are preferably fabricated of copper, although other suitable thermally conductive materials may be employed. In addition, fins 26 are preferably nickel plated in the event local condensation occurs over the coldest regions of cold plate 16. The plurality of heat sink fins 26 are preferably soldered or brazed to base 28. Generally, the fin arrangement is stamped as a continuous piece from sheet metal having a high thermal conductivity value. Other exemplary materials from which fins 26 can be fabricated include, but are not limited to, copper alloys, aluminum, aluminum alloys, and combinations of the foregoing materials.

A heat sink 24 is coupled to the opposite side of cold plate 16 on top surface 20. Heat sink 24 is operably coupled to cold plate 16 by mechanical clamping means or decoupling means such as screws or fasteners 30 (one shown). A fan may be provided (not shown) to force cooling air through fins 26 of heat sink 24. In some situations, liquids may be used.

Base 28 of heat sink 24 includes a plurality of apertures 32 configured therethrough and aligned with corresponding apertures (not shown) configured in cold plate 16 for receiving corresponding fasteners 30 to secure cold plate 16 to heat sink assembly 24. It will be recognized that at least a portion of each aperture 32 of heat sink 24 is either threaded or configured to include a threaded nut (not shown) to threadably receive a corresponding threaded end 34 of fastener 30 so that fastener 30 may be torqued to couple cold plate 16 to heat sink assembly 24 and provide a clamping force therebetween in thermal contact with top surface 20 of cold plate 16.

Still referring now to FIG. 1, fastener 30 includes a headed end 36 opposite threaded end 34 that is operably coupled to bottom surface 22 of cold plate 16. Headed end 36 is preferably defined by a perimeter larger than a perimeter of the apertures configured therethrough in cold plate 16 such that the headed portion remains disposed on the bottom surface 22 of cold plate 16. In an exemplary embodiment, headed end 36 is fixedly secured with respect to cold plate 16 as discussed more fully herein. Fastener 30 is further defined with a middle portion 38 intermediate threaded end 34 and headed end 36 that is stepped relative to each end 34, 36. Middle portion 38 is preferably stepped having a length substantially corresponding to a thickness of cold plate 16 when fastener 30 is properly torqued providing a heat transfer path from heat ink 24 to module 12. In this manner, when cold plate 16 contracts due to operation of the same, a shoulder portion 40 defining an interface between middle portion 38 and threaded end 34 maintains heat sink 24 as cold plate 16 contracts and top surface 20 of cold plate 16 decouples from heat sink 24. Furthermore, the stepped middle portion 38 provides a visual indication of proper tooling of fastener 30 relative to the thickness of cold plate 16 when cold plate 16 has a thickness of about 10 mm or marginally more. Thus, fastener 30 provides a coupling and decoupling means of cold plate 16 relative to heat sink 24 when cold plate expands and contracts dependent on whether cold plate 16 is operational.

More specifically, the decoupling means or fastener 30 provides a passive solution for introducing an "automatic" thermal switch between cold plate 16 and heat sink 24 based on whether the low temperature cooling means or cold plate 16 is active. The incorporation of fastener 30 as a decoupling means requires minimal changes to standard heat sink/evaporator/cold plate configurations.

The present invention utilizes differences in thermal expansion between cold plate 16 and fastener 30 used to attach cold plate 16 to heat sink 24. In particular, the clamp force from fastener 30 made of low thermal expansion material having a low coefficient of thermal expansion (CTE) such as Invar or Kovar, including alloys thereof, for example, in comparison to a higher thermal expansion (higher CTE) material in cold plate 16, such as copper or aluminum, for example, will vary with the temperature of cold plate 16. The specific materials and dimensions employed will be dependent on the temperature delta an the specific application where the CTE of the fastener is lower than the CTEs of the materials used in the for the objects to be coupled.

When the heat source is an electronic module 12 as illustrated in FIG. 1, cold plate 16 having thicknesses of 10 mm or more are sufficient as are flatnesses on mating thermal surfaces of 0.5 mil between cold plate 16 and base 28 of heat sink 24. Headed portion 36 clamps cold plate 16 against base 28 using threaded end 34 threadably engaged with a corresponding threaded aperture 32 or nut (not shown) therein. The fastening torque to obtain a desired clamp force is preferably accomplished with cold plate 16 at a temperature seen in application when heat sink 24 is the prime cooling means or cold plate 16 is not operational. When cold plate 16 is properly cooling to lower temperatures, (e.g., zero to 25° C.) the clamp force is relieved due to the thermal contraction of the cold plate 16 base material being much larger than that of fastener 30.

It will be recognized by one skilled in the pertinent art that although the above description of cooling unit 10 is applied to an electronic module 12 as the heat source, that the cooling unit 10 may be implemented with other heat sources to provide similar cooling benefits. It will also be recognized that in such situations, the dimensions and materials selected will depend on an operating temperature delta of the heat source and will include a fastener having a lower CTE than any of the materials selected.

An advantage obtained by employing fastener 30 having a lower CTE than that of cold plate 16 enables a more efficient cooling system by decoupling a heat transfer path of the heat sink 24 to the module 12 when the cold plate 16 disposed between heat sink 24 and module 12 being cooled is functioning. Decoupling enables a more efficient hybrid cooling system 10, particularly when system 10 is required to have forced convection through the heat sink 24 at all times. If heat sink 24 is in thermal contact with cold plate 16 when cold plate 16 is providing the primary means of cooling, heat sink 24 will dump considerable ambient heat into the cold plate as the cold plate literally chills the air between fins 26 of heat sink 24 causing undesirable condensation.

Figures 2, 3, 5:
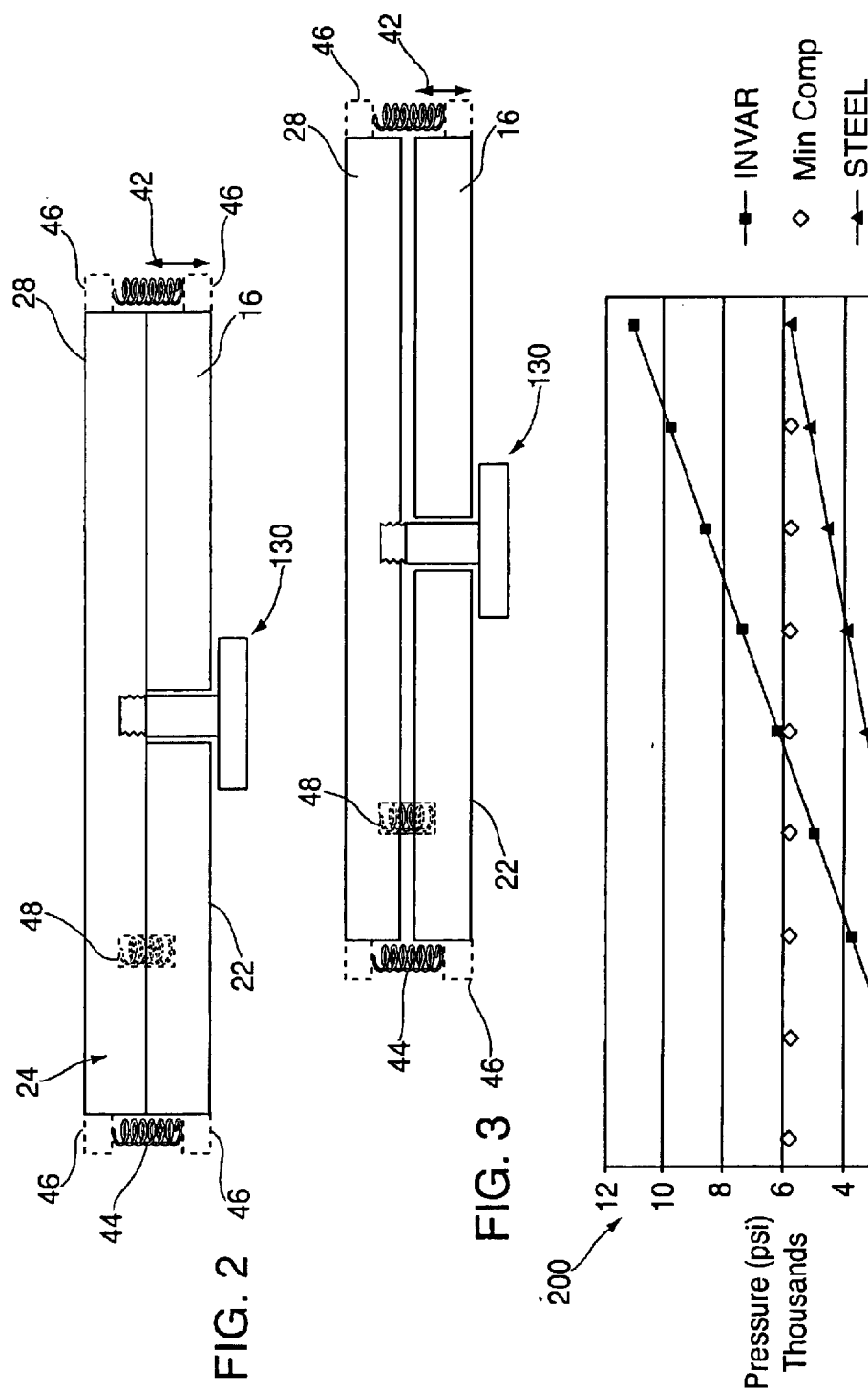
FIG. 2 is a cross sectional view of a cold plate fastened to a heat sink using a non-stepped fastener incorporating biasing members to encourage decoupling therebetween.
FIG. 3 is a cross sectional view of FIG. 2 illustrating decoupling of the cold plate fastened to the heat sink via the non-stepped fastener and the biasing members urging decoupling therebetween.
FIG. 5 is a graph of pressure versus a change in temperature from an ambient room temperature of an Invar fastener and a Steel fastener in relation to a minimum clamping force necessary to clamp the electronic module to the heat sink to maintain a heat transfer path therebetween.

Referring now to FIGS. 2 and 3, an alternative exemplary apparatus and method for achieving a passive thermal switch via utilization of thermal expansion differences to make and break the clamp force between cold plate 16 and heat sink 24 is exemplified. FIG. 2 illustrates a coupled position when heat sink 24 is the primary cooling means while FIG. 3 illustrates decoupling when cold plate 16 is the primary cooling means of a module (not shown) in thermal contact with bottom surface 22. The repeatability and size of the thermal impedance achieved between cold plate 16 and heat sink 24 can be assured by introducing a biasing member 44 therebetween. Moreover, actual physical decoupling between cold plate 16 and heat sink 24 may be achieved when cold plate 16 has a thickness 42 of at least approximately 20 mm when employed with a heat source such as an electronic module (See FIG. 3).

In an exemplary embodiment, a low force spring 44 is employed that bottoms out at high temperature conditions, allowing intimate cold plate 16 to heat sink 24 contact, but breaks the interface therebetween when the fastener torque is removed due to low temperatures of cold plate 16. It will be recognized by one skilled in the art that although biasing members 44 are shown as being disposed to lip extensions 46 (shown in phantom) extending from ends defining each cold plate 16 and heat sink 24, that each may be configured to have biasing members 44 disposed internally as indicated in phantom generally at 48 in FIGS. 2 and 3. Alternatively, fastener can be locked to bottom surface 22 of cold plate 16 as discussed above with respect to the stepped fastener 30 of FIG. 1.

By employing biasing members 44, a non-stepped fastener 130 can be employed to couple cold plate 16 to heat sink 24. Furthermore, a non-stepped fastener 130 can be more easily employed when a thickness 42 is about 20 mm as a stepped middle portion disposed in cold plate 16 is not necessary to visual check proper tooling of each.

Figure 4:
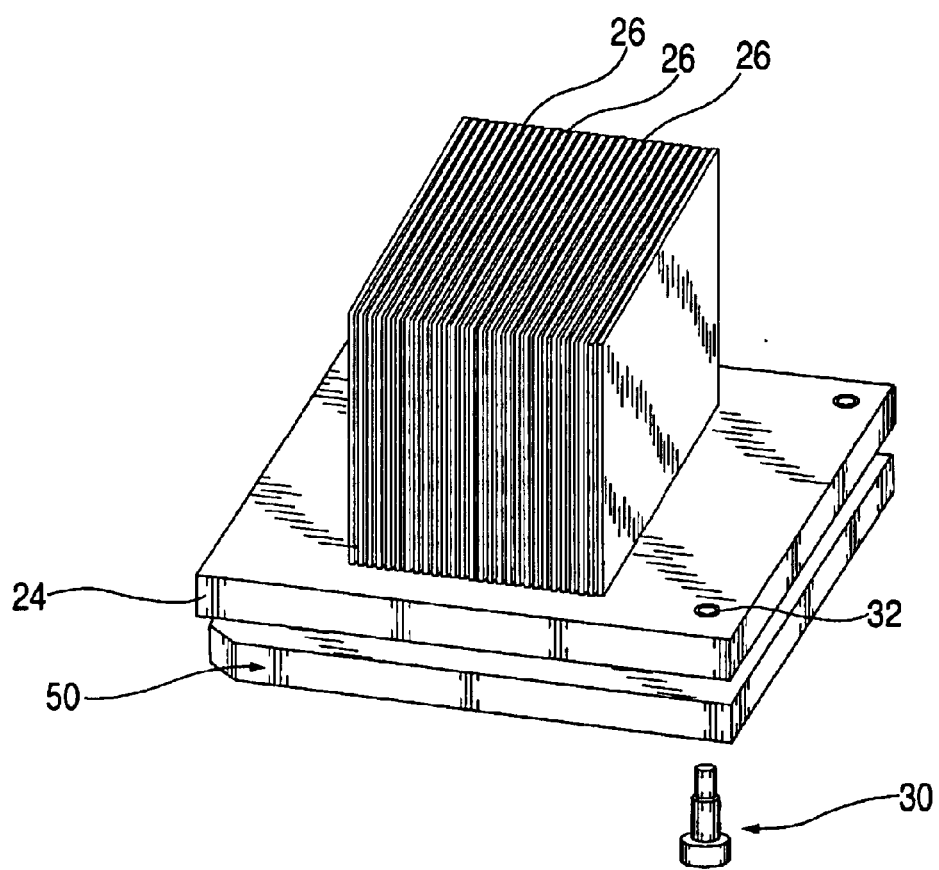
FIG. 4 is a perspective view of an alternative exemplary embodiment of a heat sink in thermal communication with an electronic module illustrating a stepped fastener having a low CTE to provide a thermal clamping force that is more uniform across a thermal interface therebetween.

Referring now to FIG. 4, an alternative embodiment of heat sink 24 in direct thermal communication with a top hat or cap 50 of electronic module 12 is illustrated using the stepped fastener 30 of FIG. 1. However, fasteners 130 configured as in FIGS. 2 and 3 may be employed, as well as fasteners having other suitable configurations. Fastener 30 is configured from a material having a lower CTE than a CTE of the materials of heat sink 24 and at least a cap of module 12 to provide a thermal clamping force that is more uniform across a thermal interface therebetween than a clamping force imparted due to a fastener having a similar CTE.

Base 28 of heat sink 24 includes a plurality of apertures 32 configured therethrough and aligned with corresponding apertures (not shown) configured in cap 50 for receiving corresponding fasteners 30 to secure cap 50 to heat sink assembly 24. As discussed above, it will be recognized that at least a portion of each aperture 32 of heat sink 24 is either threaded or configured to include a threaded nut (not shown) to threadably receive a corresponding threaded end 34 of fastener 30 so that fastener 30 may be torqued to couple cap 50 to heat sink assembly 24 and provide a clamping force therebetween.

In the past, fasteners 30 having a similar CTE as the materials employed in heat sink 24 and module 12 have loose torque problems associated with their employment at an ambient room temperature when the assembly is not operating. Thus, by assembling module 12 to heat sink 24 at a reference temperature such as at an ambient room temperature, when the assembly heats up during operation thereof, the clamping force between heat sink 24 and module 12 increases due to their respective CTE values being higher than a CTE value of the fasteners 30 threadably clamping the assembly together. In this manner, use of Belleville washers and increase torque values applied to fastener 30 may be avoided to resolve the prior loose torque problems.

In order to facilitate the cooling when refrigeration as a primary cooling means is not operational, a secondary cooling means includes a flow of air through fins 26 to effect the removal of sensible heat from module 12 in thermal contact via a heat transfer path provided by cold plate 16 therebetween coupled to heat sink 24 using fastener 30, 130. The arrangement of fins 26 disposed on base 28 over cold plate 16 facilitates air flow cooling of module 12.

However, when cold plate 16 provides the primary cooling means, refrigerant flows through channels defining cold plate 16causing cold plate 16 to contract and thermally decouple from heat sink 24 because fastener 30. 130 has a lower CTE than that of the cold plate. In this manner, when module 12 and cold plate 16 are in thermal communication, the cold refrigerant entering cold plate 12 does not cause the ambient air through fins 26 to chill where condensation may form and provide little impact on module 12 temperature and increase ambient heat flow into cold plate 16.

By eliminating a heat transfer path from heat sink 24 to cold plate 16 using a fastener having a lower CTE than that of the cold plate, condensation is mitigated between fins 26. Furthermore, ambient heat flow into the cold plate is reduced increasing the cooling efficiency provided by cold plate 16 as the pressurized refrigerant traverses therethrough (e.g., about −20° C.) without external condensation on the fins 26 of heat sink 24. In the event of a failure of the refrigeration system, cold plate 16 expands providing a heat transfer path with heat sink 24 and fins 26 are allowed to provide suitable backup cooling, although at higher temperatures compared to the primary cooling method by refrigeration, until the refrigerant system is repaired.

The above described apparatus discloses a hybrid cooling unit that uses refrigeration as a primary cooling means and uses air cooling as a secondary cooling means for a backup mode of operation for cooling an electronic device. In this manner, the above disclosed evaporator enables the benefits of refrigeration with cost and space savings of air cooling. The above described evaporator also allows lower chip temperatures without use of insulation that would inhibit the effectiveness of the air cooled backup mode. Thus, the primary and secondary cooling means disclosed allows an MCM to operate at faster cycle times with greater reliability when refrigerated and yet be satisfactorily cooled for short term usage with backup air cooling when the refrigerant system becomes inoperable. The redundant cooling provided by the air cooling means allows uninterrupted service in high end servers and avoids system shutdowns while the refrigerant system is repaired or is not needed.

Referring now to FIG. 5, a graph 200 illustrates a clamping force in pounds per square inch (psi) between cap 50 and heat sink 24 at different temperature deltas from a reference room temperature of about 20° C. More specifically, graph 200 illustrates a desired minimum compression of just less than 6000 psi coupling cap 50 and heat sink 24 using fastener 30 or 130 to prevent a loose connection. Graph 200 illustrates that at an operating temperature of 70° C. (i.e., 90° F. above room temperature of 20° C.) an Invar fastener 30 or 130 provides a higher clamping force (i.e., 11,000 psi) compared to a fastener fabricated of steel having a high CTE (i.e., 6000 psi). In fact, graph 200 illustrates that the Invar fastener 30, 130 provides at least the minimum compression at a temperature delta of 50° F. An Invar fastener increases the clamping force at a higher rate than a steel fastener as operating temperatures increase from an ambient room temperature, thereby preventing loose connections between the electronic module 12 and heat sink 24. At a certain temperature, the clamping force can be zero and recover when the temperature increases using an Invar, Kovar, or alloy thereof fastener.

The above described apparatus and method of cooling a heat source, such as an electronic module, results in minimal change to current hardware employed for cooling an elecrtonic module by changing the fastener material from steel to a lower CTE expansion material including, but not limited to, Invar and Kovar, including alloys thereof, for example. By using a fastener fabricated from a lower CTE material than the clamped the same, the thermal clamping force is a more uniform load than the clamping force due to a fastener.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. An apparatus for cooling an electronic module comprising:
   a cold plate thermally coupled to the module;
   a heat sink thermally coupled to said cold plate; and
   a means for decoupling a heat transfer path from said heat sink to said cold plate when said cold plate is functioning.

2. The apparatus of claim 1, wherein said means for decoupling includes a fastener configured to clamp said cold plate to said heat sink, said cold plate intermediate said heat sink and the module.

3. The apparatus of claim 2, wherein differences in thermal expansion between the fastener and said heat sink will make and break a clamp force when said cold plate is not functioning and functioning, respectively.

4. The apparatus of claim 2, wherein said fastener has a lower coefficient of thermal expansion than said cold plate.

5. The apparatus of claim 1, wherein said fastener is fabricated of one of Invar, Kovar, and alloys of the foregoing.

6. The apparatus of claim 1, wherein said cold plate is fabricated of one of copper and aluminum.

7. The apparatus of claim 1, wherein said cold plate has a thickness of at least 10 mm.

8. The apparatus of claim 7, wherein mating thermal surfaces between said cold plate and said heat sink have a flatness within 0.5 mil.

9. The apparatus of claim 2, wherein said fastener is torqued to provided a desired clamping force between said heat sink and said cold plate at a temperature seen in application when said heat sink is a primary cooling means of the module.

10. The apparatus of claim 1, wherein said decoupling occurs when said cold plate is cooling at temperatures between about zero to about 25° C.

11. The apparatus of claim 10, wherein a clamping force between said cold plate and said heat sink is relieved due to the thermal contraction of a base material of said cold plate being larger than that of said means for decoupling.

12. The apparatus of claim 2, wherein said means for decoupling includes said fastener configured to clamp said cold plate to said heat sink by applying a torque to said fastener and one of a biasing member configured to bottom out at high temperature conditions and said fastener fixedly disposed relative to said cold plate, allowing intimate contact between said cold plate and said heat sink and breaking such contact when said torque on said fastener is removed due to a cold plate temperature lower than high temperature conditions.

13. The apparatus of claim 12, wherein said biasing member is a low force spring.

14. A method for cooling an electronic module comprising:
   coupling at least one of a cold plate and the electronic module in thermal contact to said heat sink;
   using a fastener configured to clamp said at least one of said cold plate and the electronic module to said heat sink; and
   torqueing said fastener down to apply a first clamping force between the heat sink and said at least one of said cold plate and the electronic module at a reference temperature;
   wherein said fastener is configured to apply a second clamping force between said heat sink and at least one of said cold plate the electronic module in direct proportion to a temperature change of the assembly relative to the reference temperature.

15. The method of claim 14, wherein when coupling said heat sink in direct thermal contact to said cold plate, further comprises:
   decoupling a heat transfer path from said heat sink to said cold plate when said cold plate is functioning.

16. The method of claim 15, wherein said decoupling further comprises:
   using a fastener configured to clamp said cold plate to said heat sink, said cold plate intermediate said heat sink and the module.

17. The method of claim 16 wherein differences in thermal expansion between the fastener and said heat sink will make and break a clamp force when said cold plate is not functioning and functioning, respectively.

18. The method of claim 14, wherein said fastener has a lower coefficient of thermal expansion than said cold plate.

19. The method of claim 14, wherein said fastener is fabricated of one of Invar, Kovar, and alloys of the foregoing.

20. The method of claim 14, wherein cold plate is fabricated of one of copper and aluminum.

21. The method of claim 15 further comprising:

torqueing said fastener to provide a desired clamping force between said heat sink and said cold plate at a temperature seen in application when said heat sink is a primary cooling means of the module.

22. The method of claim 15 further comprising:

applying a torque to said fastener; and one of;

using a biasing member configured to bottom out at high temperature conditions; and fixedly disposing said fastener relative to said cold plate, wherein said applying said torque to said fastener allows intimate contact between said cold plate and said heat sink and breaking such contact when said torque on said fastener is removed due to a cold plate temperature lower than high temperature conditions.

23. The method of claim 14, wherein said coupling said heat sink in thermal contact to the electronic module is via a cap defining one end of the electronic module forming an assembly.

24. An apparatus for cooling an electronic module comprising:

a heat sink thermally coupled to the electronic module via a cap defining one end of the electronic module; and a fastener configured to apply a clamping force with respect to the electronic module and said heat sink formed assembly, said clamping force varying directly as a function of temperature of the assembly.

25. The apparatus of claim 24, wherein said fastener has a lower coefficient of thermal expansion than said cap.

26. The apparatus of claim 24, wherein said fastener is fabricated of one of Invar, Kovar, and alloys of the foregoing.

27. The apparatus of claim 24, wherein said fastener is torqued to a first torque to provide a desired clamping force between said heat sink and the electronic module at an ambient temperature and increases to a second torque seen in operation when said heat sink is a primary cooling means of the electronic module.

28. The apparatus of claim 24, wherein said clamping force between the electronic module and said heat sink is increased due to the thermal expansion of a base material of said cap coupled to said heat sink being larger than that of said fastener.

* * * * *